(12) United States Patent
Distefano et al.

(10) Patent No.: US 6,468,836 B1
(45) Date of Patent: Oct. 22, 2002

(54) LATERALLY SITUATED STRESS/STRAIN RELIEVING LEAD FOR A SEMICONDUCTOR CHIP PACKAGE

(75) Inventors: Thomas H. Distefano, Monte Sereno; Joseph Fjelstad, Sunnyvale; John W. Smith, Palo Alto, all of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/547,200

(22) Filed: Apr. 12, 2000

Related U.S. Application Data

(62) Division of application No. 09/120,006, filed on Jul. 21, 1998, now Pat. No. 6,265,759, which is a division of application No. 08/709,127, filed on Sep. 6, 1996, now Pat. No. 5,821,608.
(60) Provisional application No. 60/003,424, filed on Sep. 8, 1995.

(51) Int. Cl.[7] .................................................. H01L 21/82
(52) U.S. Cl. ........................................ 438/128; 438/615
(58) Field of Search ................................ 438/128, 612, 438/613, 614, 615, 110

(56) References Cited

U.S. PATENT DOCUMENTS

| | | | |
|---|---|---|---|
| 4,642,889 A | 2/1987 | Grabbe | 29/840 |
| 5,072,281 A | 12/1991 | Eytcheson | 357/70 |
| 5,148,265 A | 9/1992 | Khandros et al. | 357/80 |
| 5,148,266 A | 9/1992 | Khandros et al. | 357/80 |
| 5,316,788 A | 5/1994 | Dibble et al. | 427/98 |
| 5,489,749 A | 2/1996 | DiStefano et al. | 174/261 |
| 5,536,909 A | 7/1996 | DiStefano et al. | 174/261 |
| 5,581,122 A | 12/1996 | Chao et al. | 257/691 |
| 5,640,048 A | 6/1997 | Selna | 257/738 |
| 5,646,828 A | 7/1997 | Degani et al. | 361/715 |
| 5,663,593 A | 9/1997 | Mostafazadeh et al. | 257/666 |
| 5,726,489 A | 3/1998 | Matsuda et al. | 257/659 |
| 5,731,630 A | 3/1998 | Suyama et al. | 257/701 |
| 5,821,624 A | * 10/1998 | Pasch | |
| 5,844,307 A | 12/1998 | Suzuki et al. | 257/690 |
| 5,866,942 A | 2/1999 | Suzuki et al. | 257/698 |
| 5,905,303 A | * 5/1999 | Kata et al. | |
| 5,909,054 A | 6/1999 | Konozo | 257/667 |
| 6,157,075 A | * 12/2000 | Karavakis et al. | |

* cited by examiner

Primary Examiner—Caridad Everhart
(74) Attorney, Agent, or Firm—Lerner, David, Littenberg, Krumholz & Mentlik, LLP

(57) ABSTRACT

A semiconductor chip package having an internal laterally curved lead in order to compensate for the CTE mismatch between a semiconductor chip and a supporting substrate, such as a PWB.

8 Claims, 6 Drawing Sheets

LATERALLY SITUATED STRESS/STRAIN RELIEVING LEAD FOR A SEMICONDUCTOR CHIP PACKAGE

This application is a divisional application of application Ser. No. 09/120,006 filed on Jul. 21, 1998 now U.S. Pat. No. 6,265,759 which is a divisional application of application Ser. No. 08/709,127, filed on Sep. 6, 1996, now U.S. Pat. No. 5,821,608, which claims Provisional Patent Application No. 60/003,424 filed on Sep. 8, 1995.

FIELD OF THE INVENTION

The present invention relates generally to interconnecting semiconductor chips and supporting substrates, and more particularly relates to a structure for compliantly interconnecting semiconductor chips and supporting substrates while substantially obviating the problems encountered due to their differences in the thermal coefficients of expansion.

BACKGROUND OF THE INVENTION

Semiconductor chips typically are connected to external circuitry through contacts on a surface of the chip. To save area on a supporting substrate, such as a printed circuit board, these chips are typically directly connected/soldered to the substrates and from there connected to external circuitry on other parts of the substrate. The contacts on the chip are generally either disposed in regular grid-like patterns, substantially covering the front surface of the chip (commonly referred to as an "area array") or in elongated rows extending parallel to and adjacent each edge of the chip front surface.

The body of the chip package may be comprised of a molded plastic or ceramic material. Many of the techniques for solder attachment run into problems because of the thermal expansion mismatch between the material the package is composed of and the material the supporting substrate is made of, such as a printed wiring board ("PWB"). In other words, when heat is applied to the chip/substrate combination, they both expand; and when the heat is removed, the device and the substrate both contract. The problem that arises is that the device and the substrate expand and contract at different rates and at different times, thereby stressing the interconnections between them.

In attempting to use the area on printed circuit boards more efficiently, IC manufacturers have recently been switching from larger, more cumbersome interconnection conventions, such as pin grid arrays ("PGAs") and the perimeter leaded quad flat packs ("QFPs"), to smaller conventions, such as ball grid arrays ("BGAs"). Using BGA technology, semiconductor chips are typically interconnected with their supporting substrates using solder connections. However, when solder alone is used to interconnect the package's contacts to the substrate, the columns or balls of solder are generally designed to be short to maintain the solder's structural integrity. This results in minimal elastic solder connection properties which further results in increased susceptibility to solder cracking due to fatigue brought on by the thermal cycling (heating and cooling cycles of the device/substrate).

An interconnection solution put forth in U.S. Pat. No. 4,642,889, entitled "Compliant Interconnection and Method Therefor" issued Apr. 29, 1985 to Grabbe seeks to alleviate the aforementioned solder cracking problem by embedding wires within each solder column to reinforce the solder thereby allowing higher solder pedestals and more elasticity. Another solution includes spirally wrapping wire around the outside of the solder. A further solution put forth includes providing a combination of solder and high lead solder, as found in U.S. Pat. No. 5,316,788, entitled "Applying Solder to High Density Substrates" issued to Dibble et al. All of these prior art solutions are aimed at increasing the compliancy of the interconnections in order to reduce the shear stress endured by the interconnections because of the thermal cycling. However, as packages are reduced in size, the number of devices packed into a given area will be greater. The heat dissipated by the each of these devices will have a greater effect on the surrounding devices and will thus increase the need for a highly compliant interconnection scheme for each device. Further, as the number of device interconnections increases, as is the case when chips are integrated into multichip modules, the overall rigidity of the total interconnection also increases thereby again increasing the need for a highly compliant interconnection scheme. None of the aforementioned prior solutions provides an interconnection scheme which is compliant enough to effectively deal with these problems.

Certain designs have reduced solder connection fatigue by redistributing the thermal cycling stress into a portion of the chip package itself. An example of such a design is shown in commonly assigned U.S. Pat. Nos. 5,148,265 and 5,148,266, the both disclosures of which are incorporated herein by reference. One disclosed embodiment of these patents shows the use of a chip carrier in combination with a compliant layer to reduce the coefficient of thermal expansion ("CTE") mismatch problems. Typically, the compliant layer includes an elastomeric layer which, in the finished package, is disposed between the chip carrier and the face surface of the chip. The compliant layer provides resiliency to the individual terminals, allowing each terminal to move in relation to its electrically connected chip contact to accommodate CTE mismatch as necessary during testing, final assembly and thermal cycling of the device.

Despite the positive results of the aforementioned commonly owned inventions, still further improvements would be desirable.

SUMMARY OF THE INVENTION

The present invention provides a semiconductor chip package having a means to help compensate for the CTE mismatch between the chip and the PWB.

In one embodiment, the package includes a sheet-like substrate having at least one gap extending from a first surface to a second surface of the substrate. The substrate has conductive terminals which may be contacted from the second surface side of the substrate. The substrate further has conductive leads electrically connected to and extending from each terminal and across the gap or gaps. Each lead is connected to a bond pad on the opposite side of the gap, wherein each lead has an expansion section within the gap which is laterally curved with respect to the plane of the substrate. Typically, the expansion sections laterally curve at least twice in opposite directions and in one embodiment create substantially "s" shaped lead portions. A semiconductor chip having a back surface and a face surface is connected to the substrate. The chip further has a plurality of chip contacts located on a periphery of the face surface. The chip contacts are electrically and mechanically connected to respective bond pads on the substrate. This structure allows the package to compensate for CTE mismatch problems by the flexing and bending of the expansion sections of the leads within the gap(s). The substrate may also be adhered to a chip surface, either rigidly or compliantly adhered as through the use of a compliant layer between the chip and the substrate. Such a compliant layer would aid in compensating for the CTE mismatch problems. Further, the expansion sections of the leads are typically encapsulated with a compliant encapsulant to provide added support for their bending and flexing motion during thermocycling.

In a "face-down" embodiment, the first surface of the substrate overlies the face surface of the chip. If it desired that the package dimensions be kept as small as possible, the terminals will lie in a central region of the substrate bounded by the chip contacts, in a so called "fan-in" structure. Each bond pad is thus aligned with and bonded to a respective chip contact. Typically, the gap in the substrate then extends between the bond pads and the terminals such that the gap encircles the central region of the substrate creating a first substrate bearing the terminals and a second substrate bearing the bond pads. However, more than one gap may be used if it is not desired to have the bond pad portion of the substrate be discrete from the terminals portion of the substrate.

In this "face-down" structure, it may also be desired for the terminals to outside of the periphery of the chip, in a so called "fan-out" structure. In this arrangement, the substrate may be continuous beneath the chip or may have an aperture so that the face surface of the chip may be accessed after the bond pads are connected to respective chip contacts. The gap, in this arrangement is placed between the bond pads and the terminals such that the expansion sections of the leads may bend and flex to compensate for the CTE mismatch, as described above.

This face-down structure may also make use of both the fan-in and the fan-out structure in which the terminals lie on the substrate both inside and outside the periphery of the chip in a substantially co-planar arrangement. In this configuration, the bond pads reside between the inner and outer terminals. Typically, a first gap lies between the bond pads and the inner terminals and a second gap lies between the bond pads and the outer terminals. Leads connect the inner and outer terminals to respective bond pads over respective inner and outer gaps.

The package may also be arranged in a "face-up" arrangement in which the first surface of the substrate overlies the back surface of the chip. Typically in such an arrangement conductive elements, such as wirebonded wires, are bonded to respective chip contacts and bond pads and extend along side of a respective edge of the chip.

As described above in relation to the face-down arrangement, the face-up arrangement may be in a fan-in structure, a fan-out structure or a fan-in/fan-out combined structure, each having the appropriate expansion gaps and expansion sections of the leads. In the face-up embodiment, it is important to protect the chip and other exposed elements of the package, so typically the package elements on the chip side of the substrate are encapsulated. The encapsulant can be a rigid or a compliant material.

The expansion section of the leads can also be used in a package embodiment without the substrate gap such that a tip or distal end of the expansion section of each lead is bonded to a respective chip contact.

The foregoing and other objects and advantages of the present invention will be better understood from the following Detailed Description of a Preferred Embodiment, taken together with the attached Figures.

DETAILED DESCRIPTION OF A PREFERRED EMBODIMENT

The present invention makes use of a laterally curved lead within a semiconductor package in order to compensate for the CTE mismatch between a semiconductor chip and a supporting substrate, such as a PWB.

Figure 1A:
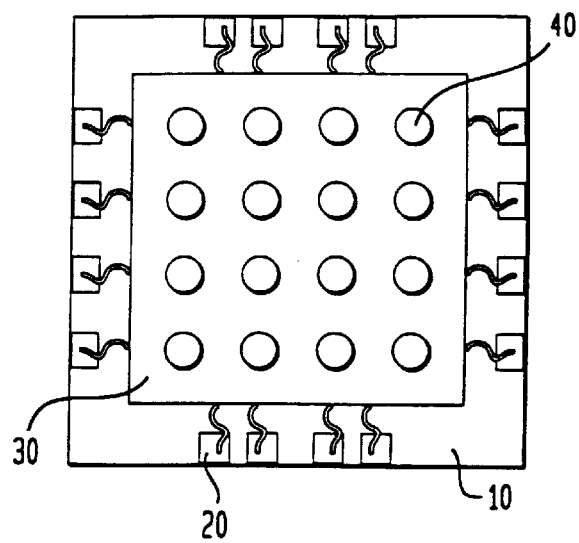
FIG. 1A shows a bottom view of a face-down, fan-in package employing an expansion lead, according to the present invention.
Figure 1B:
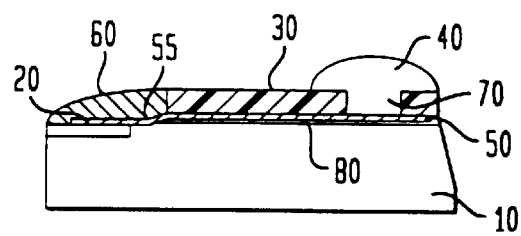
FIG. 1B shows a fragmentary cross-sectional view of a face-down, fan-in package employing an expansion lead, according to the present invention.

FIGS. 1A and 1B show a face view and a fragmentary cross-sectional view, respectively, of a chip 10 having a plurality of chip contacts 20 on a contact bearing surface. A sheet-like dielectric chip carrier substrate 30 overlies and is typically centrally located on the contact bearing surface of the chip 10 so that the chip contacts 20 are exposed. The substrate 30 may merely overly the contact bearing surface of the chip 10; however, typically, the substrate is adhesively attached to the chip surface using a thin layer of adhesive material 80, as shown in FIG. 1B. The substrate 30 may be comprised of a rigid or flexible material. Preferably, the substrate is comprised of a sheet of polyimide having a thickness approximately between 25 and 100 microns. The a first surface of the substrate 30 has a plurality of conductive terminals 40 thereon. Each of the terminals 40 is electrically connected to a chip contact 20 through conductive leads 50 extending along the opposite side of the substrate and connected to the leads 50 through conductive vias 70. Alternately, the substrate could simply be removed so that solder ball terminals could be placed directly onto the ends of the leads 50 without the need of the conductive vias 70. Each lead 50 has an expansion section 55 extending from an edge of the substrate 30. The expansion sections are each bonded to a chip contact 20, typically using conventional ultrasonic or thermosonic bonding apparatus. Each expansion section 55 is laterally curved substantially parallel to the plane of the substrate 30 prior to the bonding operation. Preferably, the expansion sections 55 laterally curve at least twice in opposite directions (substantially "s" shaped) and may be curved more than twice. The leads 50 may further be detachably connected to a supporting structure prior to bonding as disclosed and claimed in commonly assigned U.S. Pat. Nos. 5,489,749 and 5,536,909, hereby incorporated herein by reference. Typically, the expansion sections 55 of the leads are encapsulated by a suitable encapsulant, such as silicone or epoxy, to protect them from contamination and damage. During operation of the packaged chip, the terminals are attached to a PWB and the laterally curved shape of the expansion sections 55 of the leads 50 helps to compensate for the expansion and contraction of the chip during thermal cycling by having the ability to independently flex and bend. The aforementioned encapsulant 60 supports the expansion sections 55 of the leads 50 as they flex and bend and further helps to spread the forces acting on the leads. Further, a solder mask or coverlay may be placed over the exposed surface of the substrate 30 after the bonding and encapsulation steps such that only the terminals are exposed. The solder mask/coverlay is especially important in the embodiment shown in FIG. 1C because the leads 50 and the terminals 40 are on the same side of the substrate 30. The solder mask/coverlay provides a dielectric coating ensuring that the solder connecting the terminals to contacts on the PWB does not wick down the leads or short to other soldered terminals.

Figure 1C:
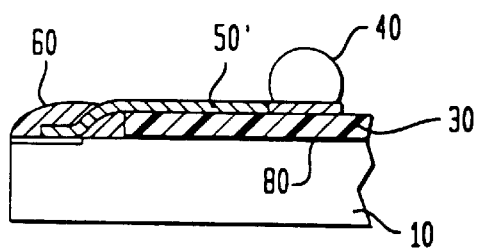
FIG. 1C shows a fragmentary cross-sectional view of a face-down, fan-in package employing an expansion lead having the leads on the second surface of the substrate, according to the present invention.

FIG. 1C shows a fragmentary cross-sectional view of an alternate embodiment in which the leads 50' are located on the same side as the terminals 40; thus, not requiring the conductive vias 70 (shown in FIG. 1B).

Figure 1D:
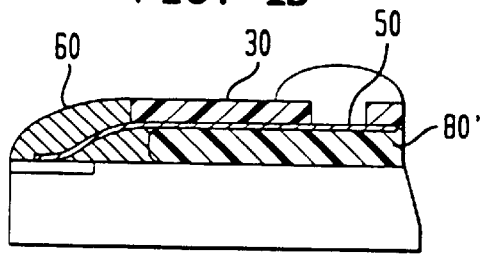
FIG. 1D shows a fragmentary cross-sectional view of a face-down, fan-in package employing an expansion lead wherein a compliant layer is disposed between the face surface of the chip and the first surface of the substrate, according to the present invention.

FIG. 1D shows a fragmentary cross-sectional view of an alternate embodiment in which the thin layer of adhesive from FIG. 1B has been replaced with a thicker layer of compliant material 80' to give added compensation for thermal mismatch, as disclosed in commonly assigned U.S. Pat. Nos. 5,148,265 and 5,148,266, hereby incorporated by reference herein. The compliant material 80' is typically about 50 to 200 microns thick and is comprised of either a thermoset or a thermoplastic material. The structure shown in FIG. 1D also allows the expansion sections 55 of the leads 50 to be shaped by the bonding operation so that they are curved in a direction perpendicular to the lateral curve of the leads 50. As stated above, these laterally and vertically curved leads are typically supported by the encapsulant 60 so as to spread the forces acting upon them during thermal cycling of the operational package.

Figure 2A:
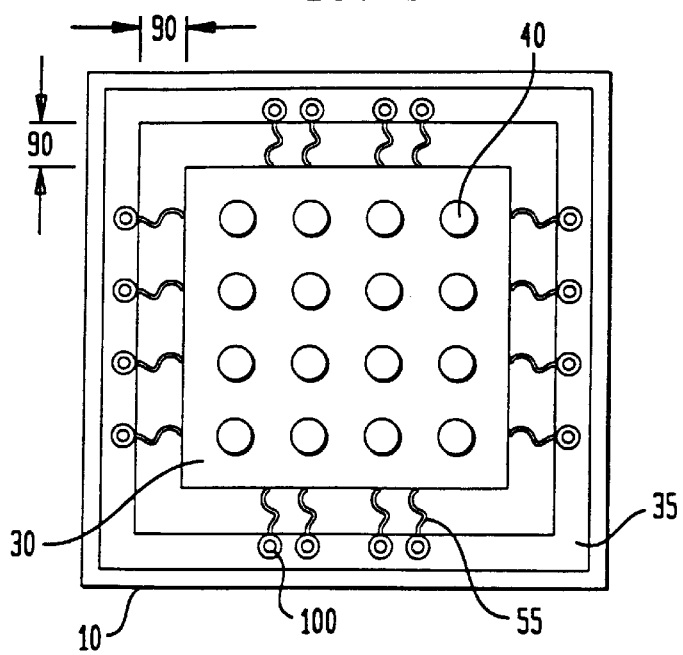
FIG. 2A shows a bottom view of a face-down, fan-in package employing an expansion/contraction gap, according to the present invention.
Figure 2B:
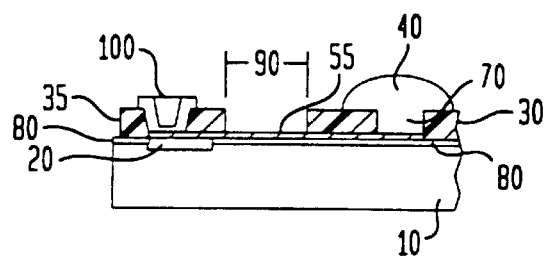
FIG. 2B shows a fragmentary cross-sectional view of a face-down, fan-in package employing an expansion/contraction gap, according to the present invention.

FIGS. 2A and 2B show a similar embodiment to that show in FIGS. 1A and 1B except that the laterally curved leads extend between the terminal bearing central substrate 30 and an outer substrate 35 thereby creating an expansion/contraction gap 90 between the two substrates such that the expansion sections 55 may independently flex and bend during operational thermal cycling of the resulting device. The outer substrate 35 is typically comprised of the same material as the central substrate 30; however, it may also be comprised of a different flexible or rigid material having the same or a different thickness when compared to the central substrate 30. In the embodiment show in FIGS. 2A and 2B, the outer substrate 35 encircles the central substrate. The outer substrate 35 further has the distal portions of the expansion sections 55 of the leads 50 connected to a coupling via 100. The coupling via 100 allows a bonder tool to transfer the bonding energy from a bonding tool to the lead/chip contact site to thereby bond each lead to a chip contact As described above, an encapsulant 60 is typically deposited around each of the expansion sections 55 of the leads 50. Further, a solder mask or coverlay may be placed over the exposed surface of the substrate 30 after the bonding and encapsulation steps such that only the terminals are exposed.

Figure 2C:
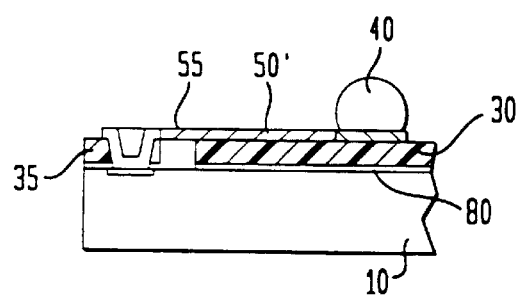
FIG. 2C shows a fragmentary cross-sectional view of a face-down, fan-in package employing an expansion/contraction gap having leads on the second surface of the substrate, according to the present invention.

FIG. 2C shows a fragmentary cross-sectional view of an alternate embodiment to FIG. 2B in which the leads 50' are located on the same side as the terminals 40; thus, not requiring the conductive vias 70 (shown in FIG. 2B).

Figure 2D:
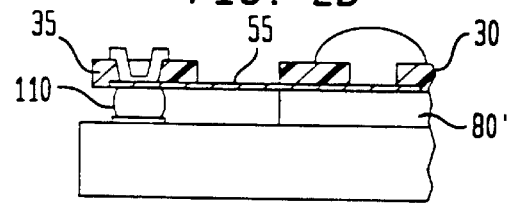
FIG. 2D shows a fragmentary cross-sectional view of a face-down, fan-in package employing an expansion/contraction gap wherein a compliant layer is disposed between the face surface of the chip and the first surface of the substrate, according to the present invention.

FIG. 2D shows a fragmentary cross-sectional view of an alternate embodiment in which the thin layer of adhesive from FIG. 2B has been replaced with a thicker layer of compliant material 80', as disclosed in connection with FIG. 1D above. The expansion sections 55 of the leads 50 may be shaped by the bonding operation so that they are curved in a direction perpendicular to the lateral curve of the leads 50, as described above, or a conductive spacer material 110 may be used such that the expansion sections remain substantially in a single plane, such as is shown in FIG. 2D. Possible examples of suitable conductive spacing materials include non-collapsing solder balls (solid core), conductive epoxy adhesives, other conductive thermoset materials and also conductive thermoplastic materials.

Figure 2E:
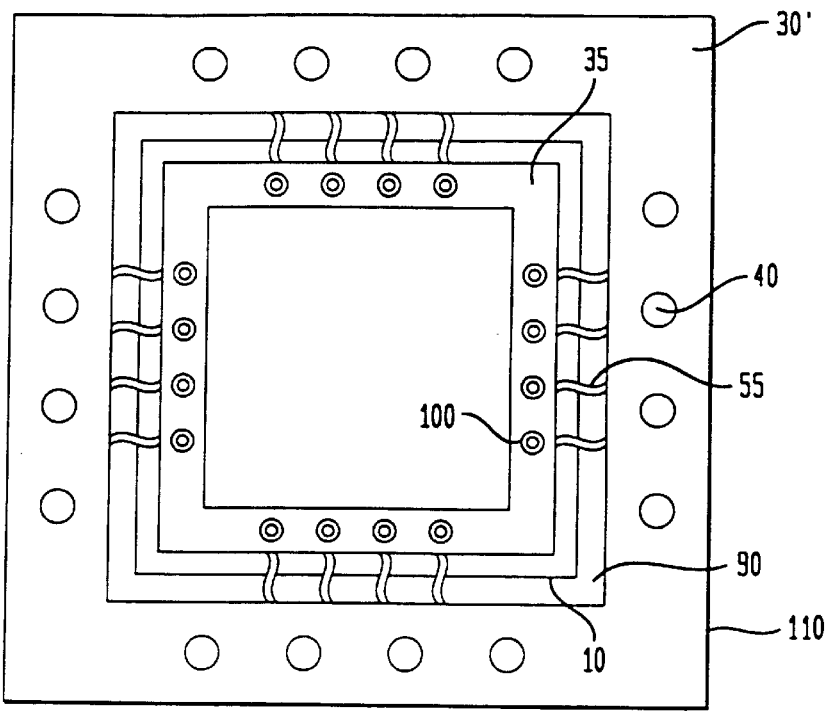
FIG. 2E shows a bottom view of a face-down, fan-out package employing an expansion/contraction gap, according to the present invention.

FIGS. 2A through 2D show so called "fan-in" embodiments where the leads extend inward from the chip contacts 20 so that package is typically no larger than the contact bearing surface of the chip 10 itself. FIG. 2E shows an alternate so called "fan-out" embodiment in which the expansion sections of the leads extend across an expansion/ contraction gap 90 which is typically positioned outside the periphery of the chip 10 itself. The terminals are then typically located on an outermost substrate 110 which encircles the substrate 35. The leads 50 electrically connect each terminal 40 to a chip contact 20 such that the curved portions within the expansion/contraction gap 90 may compensate for the CTE mismatch during operation of the finished package. Since the terminals 90 in this embodiment lie outside of the periphery of the chip 10, they may be supported by a conventional ring or flanged heat sink. Alternately, the outer edges of the substrate may be held by a substantially rigid bracket element such that the substrate is held taut.

Figure 2F:
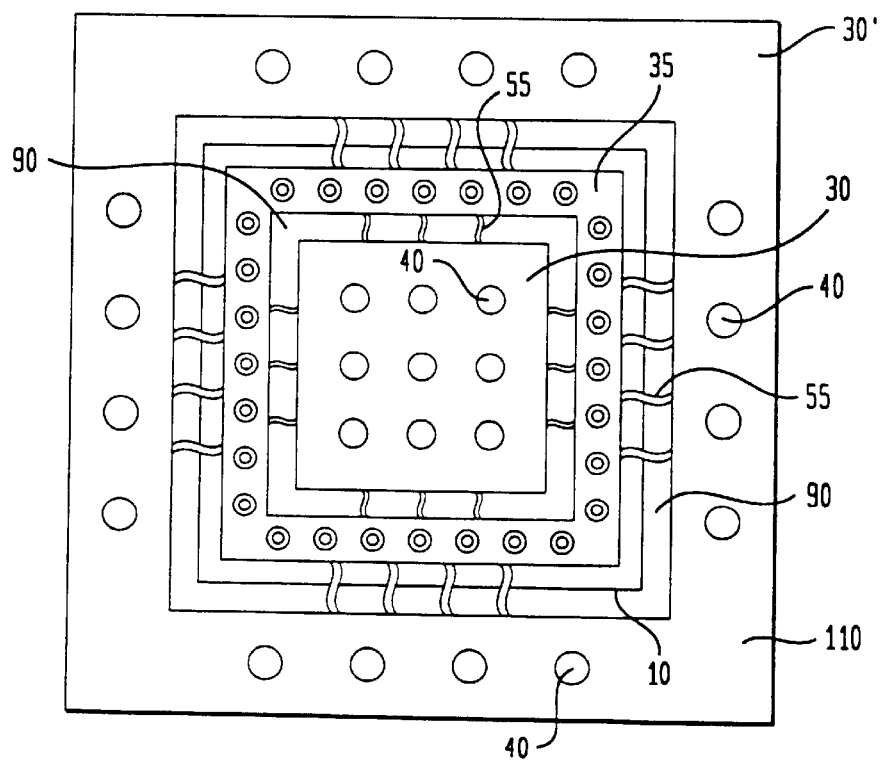
FIG. 2F shows a bottom view of a face-down, fan-in/fan-out package employing an expansion/contraction gap, according to the present invention.

FIG. 2F shows an alternate so called "fan-in and fan-out" embodiment which combines the fan-in embodiments of FIGS. 2A and 2B and the fan-out embodiment of FIG. 2E. FIG. 2F has an expansion/contraction gap 90 on either side of substrate 35 thereby allowing the expansion sections 55 of the leads 50 to extend across each respective gap 90. In this way, the leads extending inwardly to the terminals overlying the contact bearing surface of the chip 10 may compensate for the CTE mismatch during operation of the finished package. Further, the expansion sections 55 of the leads 50 extending into the outer expansion/contraction gap 90 to the terminals on the substrate beyond the periphery of the chip may also compensate for the CTE mismatch during operation of the finished package.

Figure 2G:
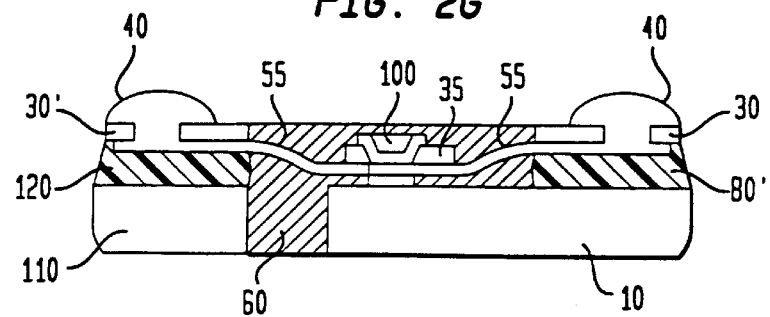
FIG. 2G shows a fragmentary cross-sectional view of the face-down, fan-in/fan-out package described in FIG. 2F combined with the compliant layer described in FIG. 2D, according to the present invention.

FIG. 2G shows a fragmentary cross-sectional view of the fan-in/out embodiment described in FIG. 2F combined with the compliant layer described in FIG. 2D. The coupling vias 100 are downwardly displaced between the central complaint material 80' and the peripheral compliant material 120 by the bonder tool. The structure shown in FIG. 2G also allows the expansion sections 55 of the leads 50 to be shaped by the bonding operation so that they are curved in a direction perpendicular to the lateral curve of the leads 50. As stated above, these laterally and vertically curved leads are typically supported by the encapsulant 60 so as to spread the forces acting upon them during thermal cycling of the operational package. This configuration also allows the leads to be gang bonded since all of the leads are connected to substrate 35 thereby allowing a gang bonding machine to simultaneously register a bonding tool to each coupling via (or the like) and bond each lead to a corresponding chip contact.

Figure 3A:
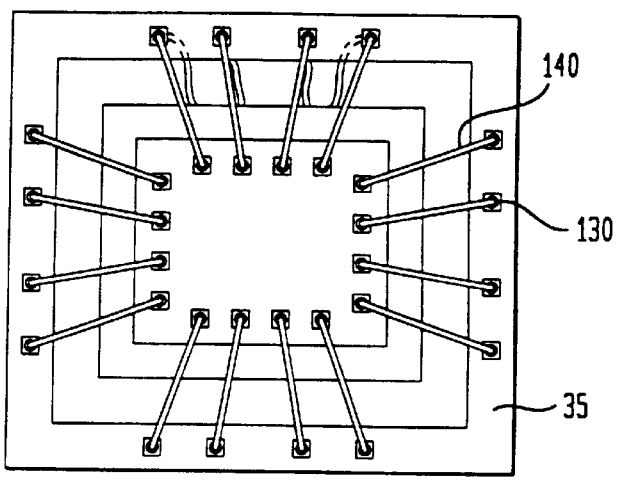
FIG. 3A shows a top view of a face-up, fan-in package employing an expansion/contraction gap, according to the present invention.
Figure 3B:
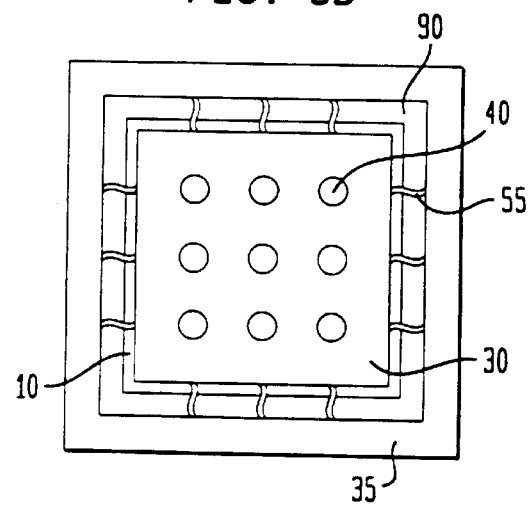
FIG. 3B shows a bottom view of a face-up, fan-in package employing an expansion/contraction gap, according to the present invention.
Figure 3C:
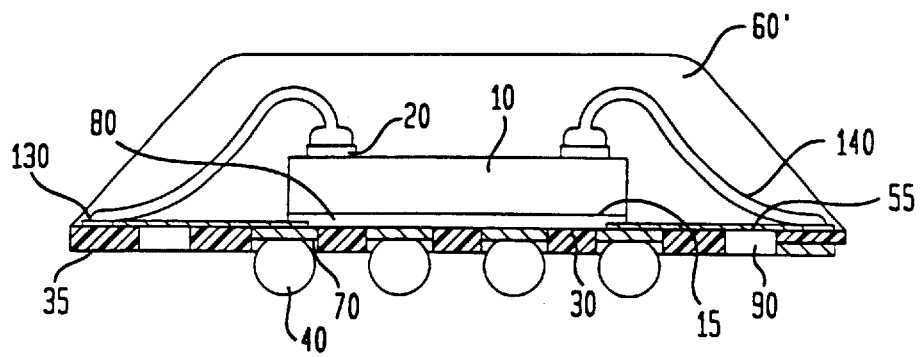
FIG. 3C shows a side cross-sectional view of an alternate face-up, fan-in package employing an expansion/contraction gap wherein the leads are located on the first surface of the substrate, according to the present invention.

FIGS. 3A through 3C show various views (top view, bottom view and cross-sectional view respectively) of a face up embodiment of the present invention. In this embodiment, a back surface 15 of the chip 10 is adhered to a central dielectric sheet-like substrate 30, typically comprised of polyimide or the like as described above, so that the chip contacts 20 face away from the substrate 30. Terminals 40 lie beneath the periphery of the back surface 15 of the chip 10. Conductive leads 50 extend from each terminal to an edge of the substrate 30. In this embodiment, the leads 50 extend on a side of the substrate 30 opposite the back surface 15 of the chip 10, but the leads 50 do not short against the chip 10 because of the dielectric adhesive therebetween. Each of the terminals 40 is electrically connected to a chip contact 20 through conductive leads 50 extending along the opposite side of the substrate and connected to the leads 50 through conductive vias 70. Alternately, the substrate could simply be removed so that solder ball terminals could be placed directly onto the ends of the leads 50 without the need of the conductive vias 70. Expansion sections 55 of the leads 50 extend beyond the periphery of the substrate 30 across an expansion/contraction gap 90 and terminate at their distal ends on a bonding pad 130 on an outer substrate 35 which substantially encircles the central substrate 30. A conventional wire bonding operation is then employed to ball or wedge bond a conductive wire 140 between each chip contact 20 and each bonding pad 130. Further, a solder mask or coverlay may be placed over the exposed surfaces of the substrates 30/35 after the bonding step such that only the terminals are exposed. The assembly is then overmolded to encapsulate the chip 10, the wires 140 and the expansion sections of the leads 55. Typically, a complaint or semi-compliant encapsulant 60' is used, such as silicone resins or flexiblizied epoxy resins. The solder mask/coverlay ensures that no encapsulant contaminates the terminals on the opposite side of the substrate 30. As described in the previous embodiments, the expansion sections 55 of the leads 50 within the expansion/contraction gap 90 help to compensate for the CTE mismatch by flexing and bending during operation of the finished package.

Figure 3D:
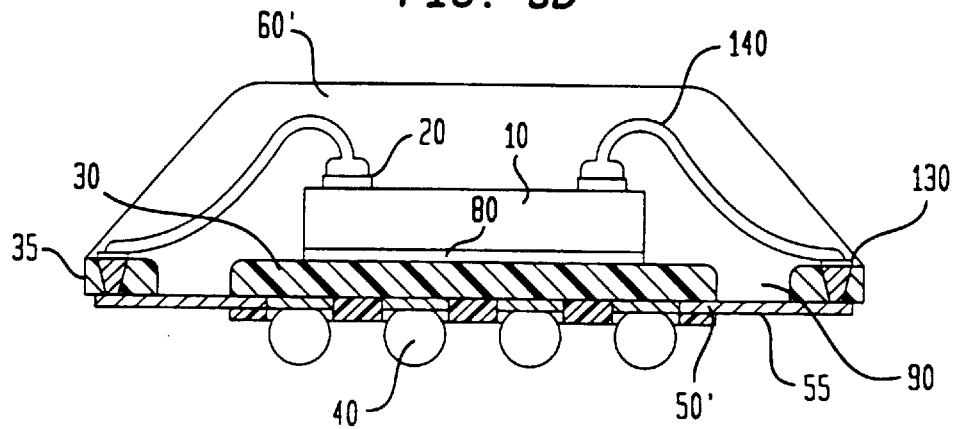
FIG. 3D shows a side cross-sectional view of an alternate face-up, fan-in package employing an expansion/contraction gap wherein the leads are located on the second surface of the substrate and covered by a solder mask, according to the present invention.

FIG. 3D shows a fragmentary cross-sectional view of an alternate embodiment to FIG. 3B in which the leads 50' are located on the same side as the terminals 40; thus, not requiring the conductive vias 70 (shown in FIG. 3C); however, such vias are required to extend from the bond pads 130 to the leads on the outer substrate 35. In this embodiment, the solder mask/coverlay is typically adhered only on the central substrate 30 so that it does not interfere with the flexing or bending of the expansion sections 55'. This embodiment further allows a more rigid encapsulant 60' to be used if desired because the encapsulant 60' is not necessarily deposited around the expansion sections 55'.

Figure 3E:
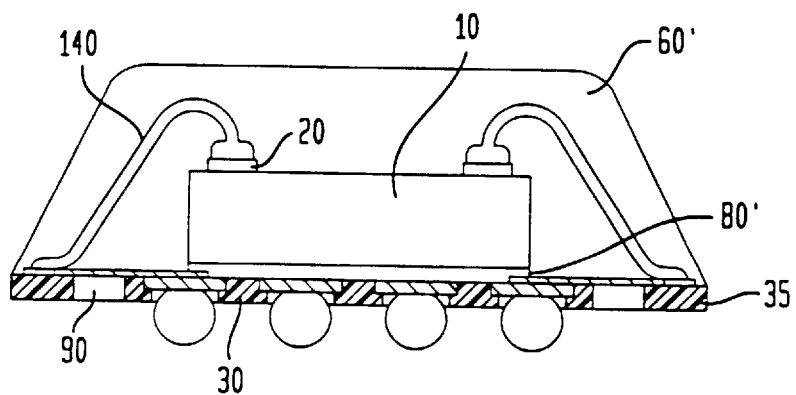
FIG. 3E shows a side cross-sectional view of an alternate face-up, fan-in package employing an expansion/contraction gap wherein a compliant layer is disposed between the back surface of the chip and the first surface of the substrate, according to the present invention.

FIG. 3E shows a fragmentary cross-sectional view of an alternate embodiment in which the thin layer of adhesive 80 from FIG. 3C has been replaced with a thicker layer of compliant material 80' to give added compensation for thermal mismatch, as disclosed above.

Figure 3F:
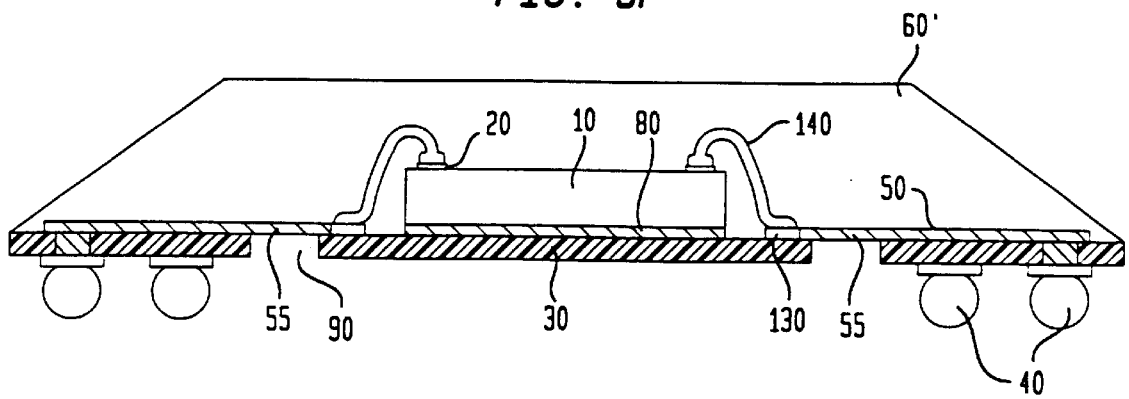
FIG. 3F shows a side cross-sectional view of an alternate face-up, fan-out package employing an expansion/contraction gap, according to the present invention.

FIG. 3F shows a fragmentary cross-sectional view of an alternate fan-out, face up embodiment in which the expansion sections of the leads extend across an expansion/contraction gap 90 which is typically positioned outside the periphery of the chip 10 itself. The terminals are typically located on an outermost substrate 110 which encircles the substrate 35. The leads 50 electrically connect each terminal 40 to a chip contact 20 such that the curved portions within the expansion/contraction gap 90 may compensate for the CTE mismatch during operation of the finished package. Since the terminals 90 in this embodiment lie outside of the periphery of the chip 10, they may be supported by the overmolded encapsulant described above. Alternately, the outer edges of the substrate may be held by a substantially rigid bracket element such that the substrate is held taut.

Figure 3G:
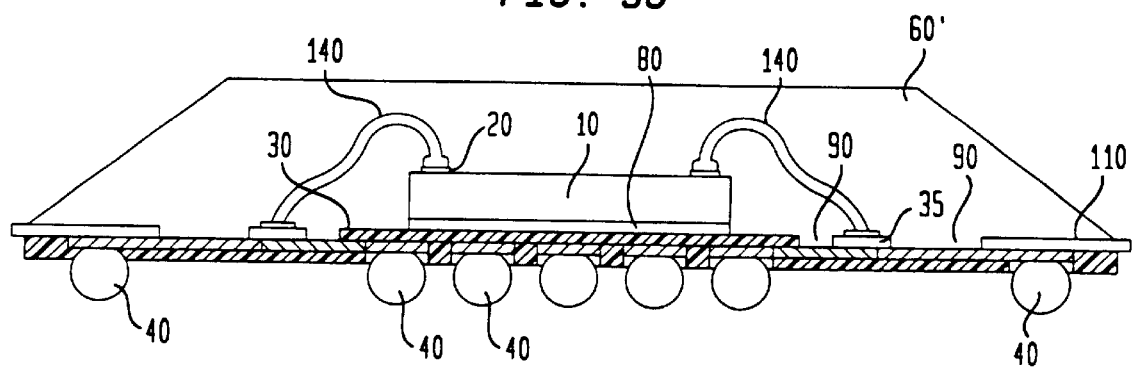
FIG. 3G shows a side cross-sectional view of an alternate face-up, fan-in/fan-out package employing an expansion/contraction gap on either side of the bond pad substrate, according to the present invention.

FIG. 3G combines the fan-in embodiments of FIG. 3A through 3C and the fan-out embodiment of FIG. 3F. FIG. 3G has an expansion/contraction gap 90 on either side of substrate 35 thereby allowing the expansion sections 55 of the leads 50 to extend across each respective gap 90. In this way, the leads extending inwardly to the terminals overlying the contact bearing surface of the chip 10 may compensate for the CTE mismatch during operation of the finished package. Further, the expansion sections 55 of the leads 50 extending into the outer expansion/contraction gap 90 to the terminals on the substrate beyond the periphery of the chip may also compensate for the CTE mismatch during operation of the finished package. Since the outer terminals 90 in this embodiment lie outside of the periphery of the chip 10, they may be supported by the overmolded encapsulant described above. Alternately, the outer edges of the substrate may be held by a substantially rigid bracket element such that the substrate is held taut. Alternately, a compliant layer such as shown in FIG. 3E may be used to aid the compensation of thermal mismatch during operation of the package.

Figure 3H:
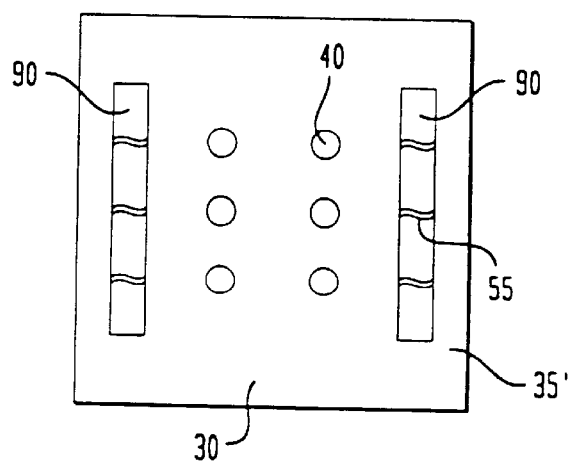
FIG. 3H shows a bottom view of an alternate face-up, fan-in embodiment of the present invention in which elongated gaps in the substrate extend parallel two of the chip edges.

FIG. 3H shows a bottom view of an alternate face-up/fan-in embodiment of the present invention in which elongated gaps 90 in the substrate 30 extend parallel two of the chip edges. The package further having terminals 40 in a center region. These types of gaps 90 can also be used on all four edges of the substrate 30 and can be used in fan-out and fan-in/fan-out embodiments as well.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

What is claimed is:

1. A method of bonding a conductive lead to a semiconductor chip contact comprising the steps of:

providing a semiconductor chip having a top surface and a plurality of contacts on said top surface;

juxtaposing a sheet-like substrate with said chip, said substrate having a first major surface facing away from said chip top surface and a second major surface facing toward said chip top surface, said substrate further including a plurality of leads and terminals on at least one of said substrate first or second surfaces, said substrate further including metallic coupling vias exposed at said second surface of said substrate for electrical and mechanical connection to respective semiconductor chip contacts, wherein said coupling vias and respective terminals are interconnected by said leads; and engaging a bonding tool with said coupling vias and transferring energy through said coupling vias to bond said coupling vias to respective chip contacts.

2. The method of bonding as claimed in claim 1, wherein said coupling vias are exposed at said first surface of said substrate.

3. The method of bonding as claimed in claim 2, wherein said coupling vias have a recess therein to allow said bonding tool to enter therein for better transfer of energy during the bonding of said coupling vias and said chip contacts.

4. The method of bonding as claimed in claim 1, wherein said engaging step further includes the step of urging said coupling vias and portions of said leads out of the plane of said substrate.

5. The method of bonding as claimed in claim 4, wherein said leads include laterally curving sections that are urged out of the plane of the substrate during said engaging step.

6. The method of bonding as claimed in claim 1, wherein said engaging step further includes the step of registering a plurality of bonding tools with respective coupling vias and simultaneously bonding each said engaged coupling via to a respective chip contact.

7. The method of bonding as claimed in claim 1, attaching a conductive spacing material to said coupling vias prior to said engaging step such that said engaging step bonds said conductive spacing material to respective chip contacts.

8. The method of bonding as claimed in claim 7, wherein said conductive spacing material is selected from the group consisting of non-collapsing solder balls, conductive epoxy adhesives, conductive thermoset material and conductive thermoplastic materials.

\* \* \* \* \*

UNITED STATES PATENT AND TRADEMARK OFFICE
CERTIFICATE OF CORRECTION

PATENT NO. : 6,468,836 B1
DATED : October 22, 2002
INVENTOR(S) : Thomas H. DiStefano, Joseph Fjelstad and John W. Smith It is certified that error appears in the above-identified patent and that said Letters Patent is hereby corrected as shown below:

<u>Title page,</u>
Item [75], Inventors, "Distefano" should read -- DiStefano --.

<u>Column 6,</u>
Line 37, "contact As" should read -- contact. As --.

Signed and Sealed this

Fourth Day of March, 2003

JAMES E. ROGAN
*Director of the United States Patent and Trademark Office*